(12) United States Patent
Xin et al.

(10) Patent No.: US 11,165,131 B2
(45) Date of Patent: Nov. 2, 2021

(54) HEAT STRUCTURE FOR THERMAL MITIGATION

(71) Applicant: Motorola Mobility LLC, Chicago, IL (US)

(72) Inventors: Wei Xin, Baoding (CN); Martin Rabindra Pais, North Barrington, IL (US); MD Rashidul Islam, Glen Ellyn, IL (US)

(73) Assignee: Motorola Mobility LLC, Chicago, IL (US)

( * ) Notice: Subject to any disclaimer, the term of this patent is extended or adjusted under 35 U.S.C. 154(b) by 58 days.

(21) Appl. No.: 16/838,664

(22) Filed: Apr. 2, 2020

(65) Prior Publication Data
US 2021/0288392 A1  Sep. 16, 2021

(30) Foreign Application Priority Data
Mar. 10, 2020  (CN) .......................... 202010161146.X

(51) Int. Cl.
| | | |
|---|---|---|
| *H03M 1/48* | (2006.01) |
| *H01Q 1/02* | (2006.01) |
| *F28F 3/00* | (2006.01) |
| *F28F 21/00* | (2006.01) |
| *H01Q 1/48* | (2006.01) |
| *H05K 5/02* | (2006.01) |

(Continued)

(52) U.S. Cl.
CPC .................. *H01Q 1/02* (2013.01); *F28F 3/00* (2013.01); *F28F 21/00* (2013.01); *H01Q 1/243* (2013.01); *H01Q 1/48* (2013.01); *H05K 5/0247* (2013.01); *H05K 7/20472* (2013.01)

(58) Field of Classification Search
CPC ............ H01Q 1/02; H01Q 1/48; H01Q 1/243; H05K 7/20472; H05K 5/0247; F28F 3/00; F28F 21/00

USPC .......................................................... 343/848
See application file for complete search history.

(56) References Cited

U.S. PATENT DOCUMENTS

| | | | | |
|---|---|---|---|---|
| 7,710,045 | B2 * | 5/2010 | Schultz ................ | H05K 1/0204 315/246 |
| 8,077,475 | B2 * | 12/2011 | Otremba ........... | H01L 23/49562 361/770 |

(Continued)

OTHER PUBLICATIONS

Boadu,"Thermal Analysis of laminated (Copper—Graphite) as Heat Spreader Material", May 2014, 12 pages.

(Continued)

*Primary Examiner* — Jean B Jeanglaude
(74) *Attorney, Agent, or Firm* — Fig. 1 Patents

(57) ABSTRACT

Implementations for heat structure for thermal mitigation are described. The described heat structures, for instance, provide a multi-layered structure that optimizes heat spreading and dissipation, as well as wireless performance of wireless devices. A heat structure, for instance, is installed internally in a wireless device adjacent various internal components to absorb heat generated by the components, and to dissipate the heat. According to various implementations, a heat structure is implemented as a thermally conductive layer surrounded by layers of electrically conductive material. Electrically conductive vias can be formed that traverse the thermally conductive layer and form an electrical connection between different electrically conductive layers to mitigate current flow in the thermally conductive layer.

20 Claims, 8 Drawing Sheets

(51) Int. Cl.
*H01Q 1/24* (2006.01)
*H05K 7/20* (2006.01)

(56) References Cited

U.S. PATENT DOCUMENTS

| | | | | |
|---|---|---|---|---|
| 8,806,741 | B2 * | 8/2014 | Otremba | H01L 23/49562 |
| | | | | 29/832 |
| 10,897,812 | B2 * | 1/2021 | Lee | H05K 1/0219 |
| 2007/0216274 | A1 * | 9/2007 | Schultz | H05K 1/0204 |
| | | | | 313/46 |
| 2009/0083963 | A1 * | 4/2009 | Otremba | H01L 23/49562 |
| | | | | 29/592.1 |
| 2012/0027928 | A1 * | 2/2012 | Otremba | H01L 23/49562 |
| | | | | 427/122 |
| 2018/0211899 | A1 * | 7/2018 | Morianz | H01L 23/5386 |

OTHER PUBLICATIONS

Lemak,"High Performance Pyrolytic Graphite Heat Spreaders: Near Isotropic Structures and Metallization", Oct. 2008, 25 pages.
Norley,"The Development of a Natural Graphite Heat-Spreader", Mar. 2001, 4 pages.
Smale,"Thermal Performance of Natural Graphite Heat Spreaders", Jul. 2005, 11 pages.

* cited by examiner

HEAT STRUCTURE FOR THERMAL MITIGATION

RELATED APPLICATION

This application claims the priority benefit of China Patent Application for Invention Serial No. 202010161146.X filed Mar. 10, 2020 entitled "Heat Structure for Thermal Mitigation" the disclosure of which is incorporated by reference herein in its entirety.

BACKGROUND

Devices such as smart devices, wireless devices (e.g., cellular phones and tablet devices), consumer electronics, and the like can be implemented for use in a wide range of industries and for a variety of different applications. Many of these devices can be configured for wireless cellular communications, which is ever-expanding to include multiple communication bands and modulation schemes, such as GSM/2G, UMTS/3G, and LTE/4G. Additionally, fifth generation (5G) cellular network technology is being implemented to accommodate mmWave (mmW) frequencies, and provides for faster data downloads and more network reliability. In addition to wireless cellular communications, modern wireless devices may utilize a variety of other types of wireless technologies, such as Bluetooth™, WiFi™, near field communication (NFC), and so forth.

Antenna configurations in these devices are designed to accommodate multiple transmit and receive antennas to exploit multipath propagation, particularly in the mmNR bands (New Radio frequency range, including frequency bands in the mmWave range between 24-100 GHz). For a 5G antenna configurations, the generated heat load can be extensive, exceeding device component operating temperature ranges, and exceeding user comfort levels for holding and using a device. Generally, these 5G devices are implemented for higher data rates and faster communication performance, and antenna modules can reach their thermal spec limits in a very short amount of time, causing a need for some form of thermal mitigation or device shutdown.

Some techniques have been developed to attempt to manage thermal conditions in such devices, such as by using heat spreaders or heat sinks to channel and distribute heat over a device. However, typical materials utilized by such techniques exhibit lossy electrically conductive features when implemented near antennas and tend to introduce radio frequency (RF) diffraction, copper (I²R) loss, and other problematic effects that reduce RF efficiency and thus result in increased RF power demands on a device.

BRIEF DESCRIPTION OF THE DRAWINGS

Implementations of the techniques for heat structure for thermal mitigation are described with reference to the following Figures. The same numbers may be used throughout to reference like features and components shown in the Figures.

DETAILED DESCRIPTION

Implementations for heat structure for thermal mitigation are described, and provide techniques to address not only the heat generated by components of wireless devices (e.g., components of 5G wireless devices), but also to manage and improve the radio frequency (RF) performance that might otherwise be affected by convention thermal mitigation techniques. The described heat structures, for instance, provide a multi-layered structure that optimizes heat spreading and dissipation, as well as wireless performance of wireless devices. A heat structure, for instance, is installed internally in a wireless device adjacent various internal components to absorb heat generated by the components and to spread and dissipate the heat.

According to various implementations, a heat structure is implemented as a thermally conductive layer surrounded by layers of electrically conductive material. Generally, the electrically conductive layers optimize wireless performance by mitigating RF absorption and distortion that may be caused by wireless signal contacting the thermally conductive layer. For instance, an outer electrically conductive layer of the heat structure creates a high-impedance surface that minimizes coupling of RF signals to the surface, creating a "reflective" surface that mitigates RF absorption and enables wireless signal to be received and transmitted more freely by an adjacent antenna. Further, the thermally conductive layer is formed from a thermally conductive material that promotes heat spreading across the heat structure, enabling heat generated by components of a wireless device to be more readily dissipated. Electrically conductive vias can be formed that traverse the thermally conductive layer and form an electrical connection between different electrically conductive layers to short circuit the electrically conductive layers and to mitigate current flow in the thermally conductive layer. Generally, this reduces signal loss that may result from signal absorption into the thermally conductive layer.

While features and concepts of heat structure for thermal mitigation can be implemented in any number of different devices, systems, environments, and/or configurations, implementations of heat structure for thermal mitigation are described in the context of the following example devices, systems, and method.

Figure 1:
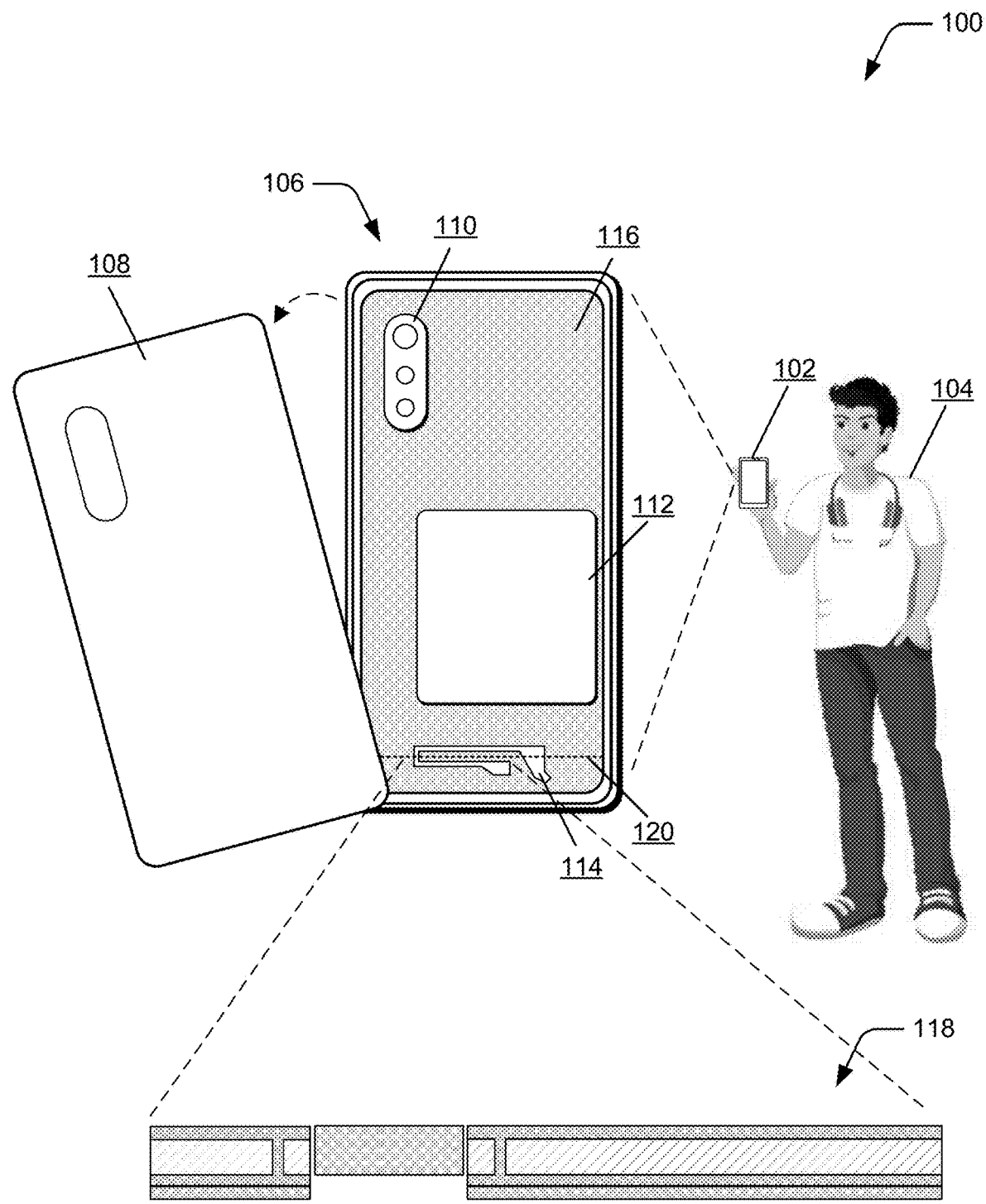
FIG. 1 depicts an environment in which techniques for heat structure for thermal mitigation may be employed in accordance with one or more implementations of the techniques described herein.

FIG. 1 depicts an environment 100 in which techniques for heat structure for thermal mitigation may be employed. The environment 100 includes a wireless device 102 being held by a user 104. Generally, the wireless device 102 may be implemented in a variety of different ways, such as a smartphone, a tablet device, a laptop, a wearable computing device (e.g., a smartwatch or a fitness tracker), and so forth.

These examples are not to be construed as limiting, however, and the wireless device 102 can be implemented in a variety of different ways and form factors. Further example attributes of the wireless device 102 are discussed below with reference to the device 800 of FIG. 8.

The environment 100 also depicts an internal view 106 of the wireless device 102 with a surface portion 108 of the wireless device 102 removed. The surface portion 108, for instance, represents a cover of the wireless device 102, such as a rear cover. The internal view 106 enables various internal components of the wireless device 102 to be viewable. The internal components, for instance, include imaging components 110, a battery 112, and an antenna 114. The imaging components 110, for instance, represent functionality for capturing images and/or light-related phenomena, and can include a lens, a light source, a light sensor, and so forth. The battery 112 represents a power source for the wireless device 102, and the antenna 114 represents functionality for transmitting and receiving wireless signal, such as part of 5G wireless cellular communication. While a single antenna is specifically mentioned here, it is to be appreciated that the wireless device 102 will typically include multiple different antennas positioned at different regions internally to the wireless device 102.

Figure 2:
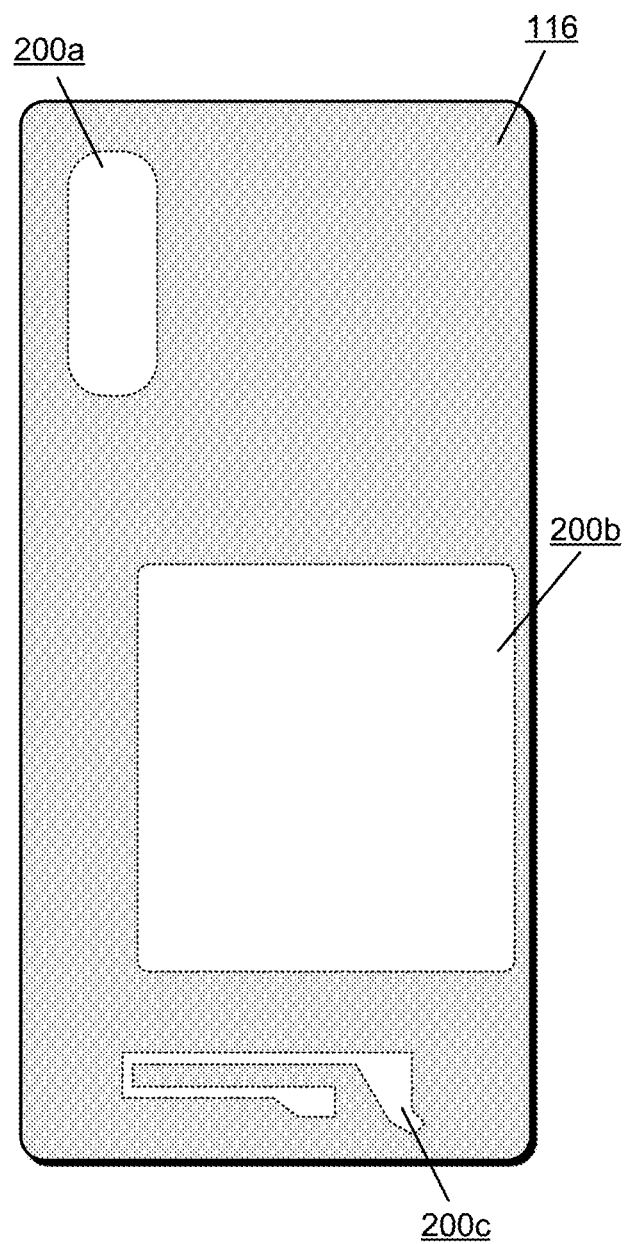
FIG. 2 depicts a heat structure removed and separate from a wireless device and other components of the wireless device in accordance with one or more implementations of the techniques described herein.

The internal components of the wireless device 102 further include a heat spreader and dispersal structure ("heat structure") 116, which represents functionality for spreading and dispersing heat generated by various components of the wireless device 102. In this particular example, the heat structure 116 surrounds various components of the wireless device 102 so as to minimize interference with operation of the components. For instance, FIG. 2 depicts the heat structure 116 removed and separate from the wireless device 102 and other components of the wireless device 102. As illustrated in FIG. 2, the heat structure 116 includes cavities 200a, 200b, and 200c. Generally, the cavities 200 represent voids (e.g., holes and/or cutouts) in the heat structure 116 that can accommodate components of the wireless device 102. For instance, the cavity 200a is positioned to accommodate the imaging components 110, the cavity 200b the battery 112, and the cavity 200c the antenna 114. These cavities are presented for purpose of example only, and it is to be appreciated that implementations of the heat structures described herein can include a variety of different cavities and can be implemented in a variety of different configurations to accommodate numerous different device designs and configurations.

Returning to FIG. 1, the environment 100 further depicts a cross section 118 (e.g., a lateral cross section) of the heat structure 116. The cross section 118, for instance, is taken from a portion of a lateral region 120 of the heat structure 116. The cross section 118 depicts various structural features of the heat structure, examples of which are detailed in the proceeding discussion.

Figure 3:
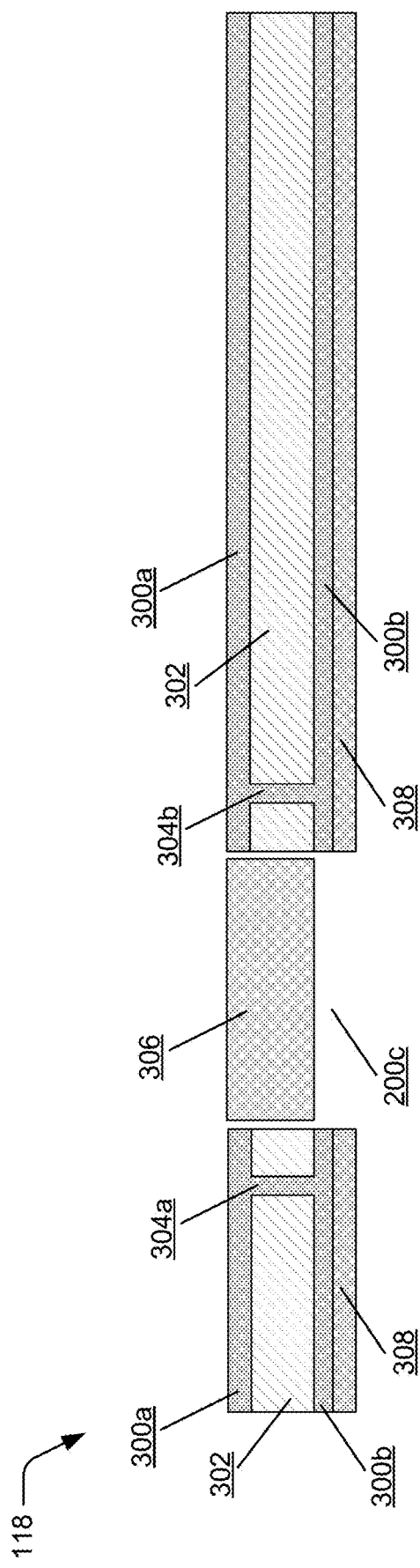
FIG. 3 depicts an enlarged view of a cross section of a heat structure in accordance with one or more implementations of the techniques described herein.

FIG. 3 depicts an enlarged view of the cross section 118 of the heat structure 116. In this particular example, the heat structure 116 includes an electrically conductive layer 300a and an electrically conductive layer 300b with a thermally conductive layer 302 in between. Generally, the electrically conductive layers 300 can be formed from any suitable conductive material, such as copper (Cu), aluminum (Al), silver (Ag), gold (Au), etc. Further, the thermally conductive layer 302 can be formed from any suitable material that exhibits desirable thermal conductivity, such as graphite and/or other suitable carbon-based material. The electrically conductive layers 300 can be adhered to the thermally conductive layer 302 using any suitable lamination technique, such as electroplating, adhesive, physical vapor deposition (PVD), and so forth. Further, the electrically conductive layers 300 and the thermally conductive layer 302 are positioned parallel to one another.

The cross section 118 further illustrates a via 304a and a via 304b, which represent electrically conductive connectors that connect the electrically conductive layers 300a, 300b across the thermally conductive layer 302. In at least one implementation, the vias 304 represent electrically conductive material placed in perforations in the thermally conductive layer 302 and that run perpendicular to the electrically conductive layers 300. The vias 304, for instance, are formed from the same material as the electrically conductive layers 300 and function to short circuit the electrically conductive layers 300 to mitigate (e.g., prevent) current flow in the thermally conductive layer 302. Generally, by mitigating current flow in the thermally conductive layer 302, wireless performance of the wireless device 102 is enhanced in comparison with convention heat mitigation techniques. For instance, the cross section 118 illustrates an antenna section 306, which represents a cross section of the antenna 114. In this particular example, the antenna 114 is positioned within the cavity 200c and is coplanar with the heat structure 116. This is not intended to be limiting, however, and implementations described herein can utilize a wide variety of different positional relationships between internal components of a wireless device (e.g., the antenna 114) and a heat structure.

The cross section 118 further depicts an adhesive layer 308 adhered to the electrically conductive layer 300b and which is usable to adhere the heat structure 116 to a wireless device. The adhesive layer 308, for instance, is utilized to adhere and enable good thermal contact between the heat structure 116 to internal components of the wireless device 102, such as to enable thermal conduction from the internal components across the adhesive layer to the other layers of the heat structure 116. This is not intended to be limiting, however, and other attachment techniques may additionally or alternatively be employed, such as mechanical attachment, magnetic attachment, pastes, etc.

Figure 4:
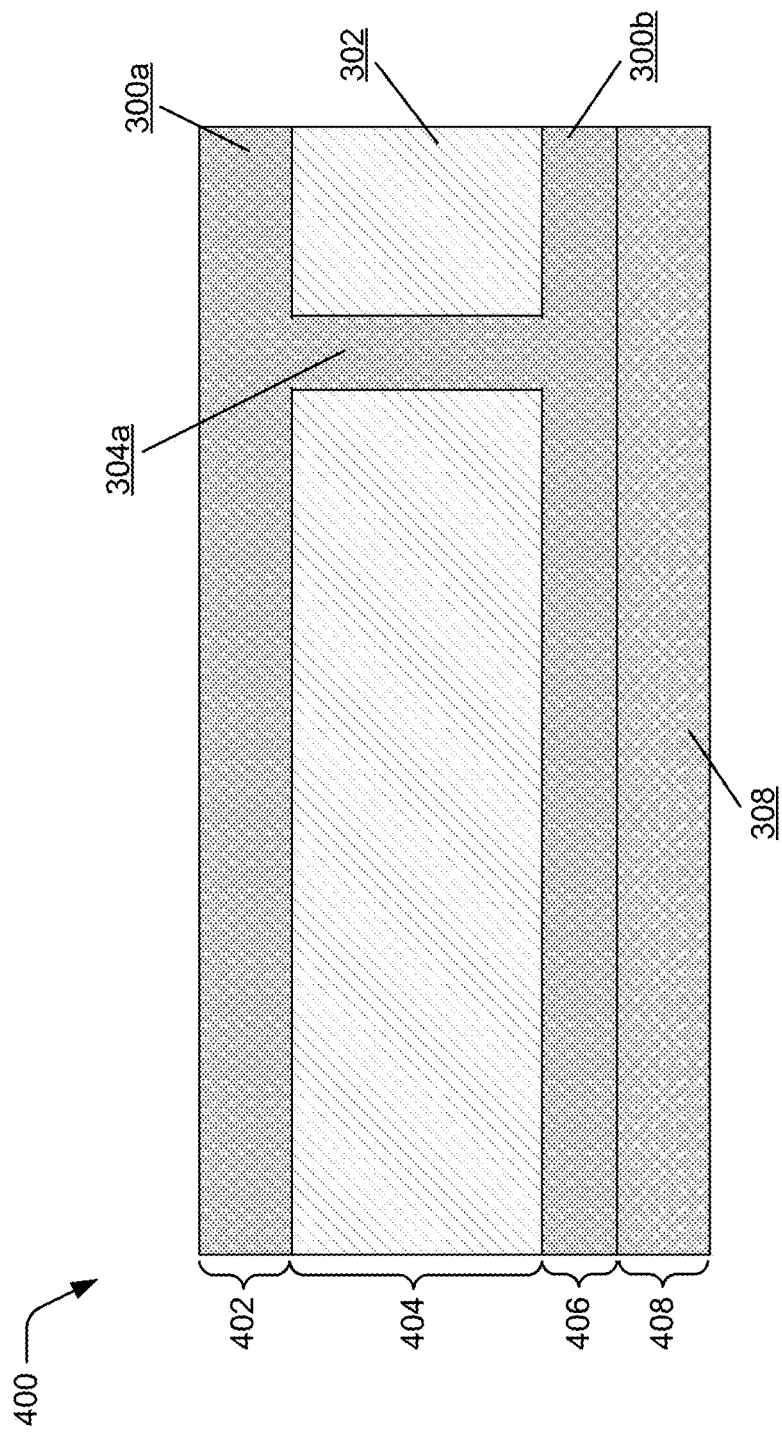
FIG. 4 depicts a cross section portion of a cross section of a heat structure.

To enhance wireless performance of the antenna 114 and/or other wireless components of the wireless device 102, dimensions of the various structural features of the heat structure 116 are optimized. For instance, consider FIG. 4, which depicts a cross section portion 400 of the cross section 118. The section portion 400 depicts different dimensions of the heat structure 116, including a thickness 402 of the electrically conductive layer 300a, a thickness 404 of the thermally conductive layer 302, a thickness 406 of the electrically conductive layer 300b, and a thickness 408 of the adhesive layer 308.

In at least one implementation, the thickness 402 of the electrically conductive layer 300a is specified based on a skin depth of a material used to form the electrically conductive layer 300a. Generally, a "skin depth" of a material refers to a depth from a surface of a material in which electrical current tends to flow. For instance, when electrical current of a certain frequency is applied to a material, an outer surface of the material tends to have a higher current density, with current density decreasing with increasing distance from the surface. Beyond a skin depth from a surface of a particular material, little or no electrical current flow may be observed. Accordingly, the thickness 402 of the electrically conductive layer 300a may be specified based on a skin depth of a corresponding material to optimize current flow along the electrically conductive layer 300a and to prevent current flow from an external source (e.g., a received wireless signal) from contacting the thermally conductive layer 302. Generally, this mitigates signal loss that may occur based on wireless signal being absorbed by the thermally conductive layer 302.

One example way for determining a skin depth of a material uses the equation:

$$\delta = \sqrt{\frac{\rho}{\pi f \mu}} = \sqrt{\frac{\rho}{\pi f \mu_r \mu_o}}$$

where:
δ=skin depth
ρ=Resistivity of material of electrically conductive material
$\mu_o$=Permeability of free space=$4\pi \times 10^{-7}$
$\mu_r$=Relative permeability of electrically conductive material
f=frequency of electrical current, e.g., wireless signal frequency received at wireless device 102.

In at least one implementation, the thickness 402 of the electrically conductive layer 300a is specified as δ+n, and/or 1.25δ. Generally, utilizing a thickness 402 that is greater than the skin depth mitigates wireless signal being absorbed into the thermally conductive layer 302. For instance, wireless signal absorption by the thermally conductive layer 302 can decrease wireless performance of the wireless device 102, such as by reducing received wireless signal strength and/or quality, and/or by requiring more power to be allocated to antennas of the wireless device 102.

The thickness 404 of the thermally conductive layer 302 can be specified as equal to or less than λ/4, where λ is the wavelength of a frequency of a set of wireless frequencies utilized by the wireless device 102, e.g., a highest frequency of the set. Further, the thickness 406 of the electrically conductive layer 300b may be the same or more than the thickness 402. The thickness 408 of the adhesive layer 308 may be approximately less than 10 micrometers (μm), e.g., 7 μm+/−2 μm.

In at least one implementation, the vias 304a, 304b are positioned at a λ/4 pitch (e.g., center-to-center distance) relative to one another, and may be positioned such that the antenna 114 is centered between the vias 304 and may be positioned at a different height than the vias 304. These dimensions for the various layers and components of the heat structure 116 are provided for purpose of example only, and it is to be appreciated that the described implementations can utilize a variety of different dimensions within the scope of the claimed implementations.

Figure 5:
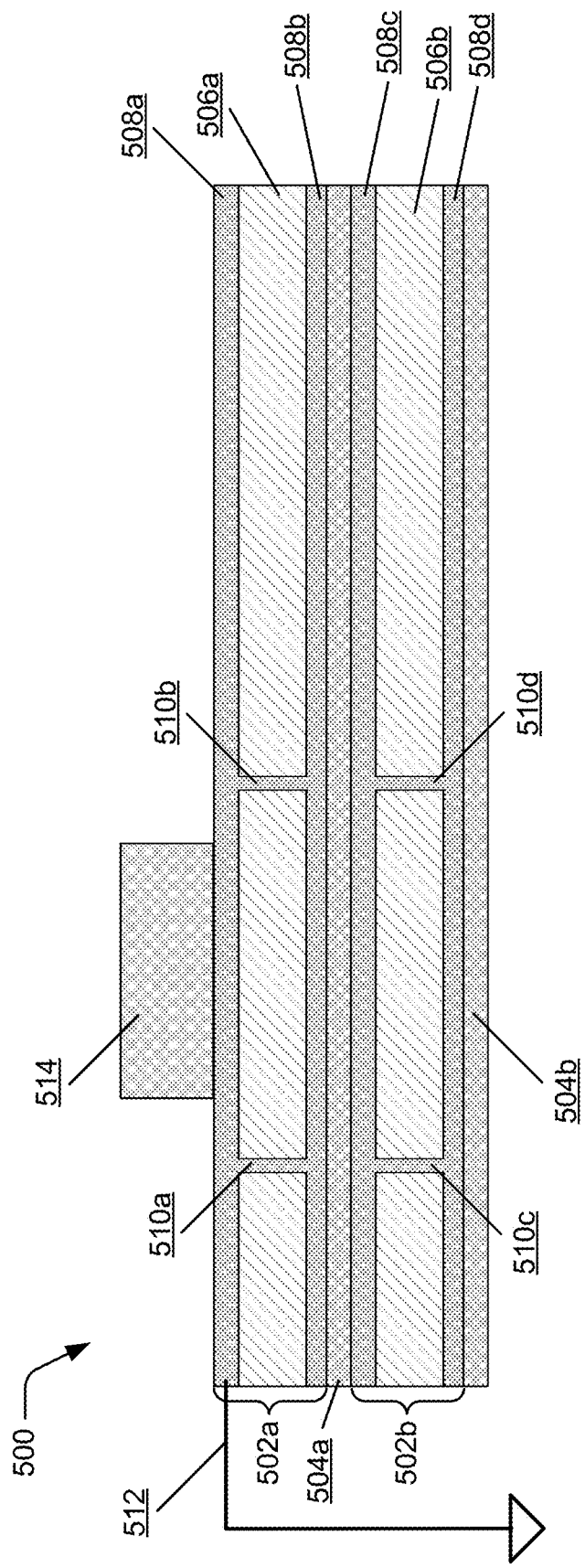
FIG. 5 depicts a cross section of another example implementation of a heat structure.

FIG. 5 depicts a cross section 500 of another example implementation of the heat structure 116. In this particular example, the heat structure 116 includes a sublayer 502a and a sublayer 502b adhered to one another via an adhesive layer 504a. In at least one implementation, adhesive layer 504a can be electrically conductive to cause conductive layers of the heat structure 116 to be grounded to each other, such as depending on the electrical ground topology utilized. Further, the sublayer 502a includes a thermally conductive layer 506a with an electrically conductive layer 508a adhered to a top surface of the thermally conductive layer 506a, and an electrically conductive layer 508b adhered to a bottom surface of the thermally conductive layer 506a. The sublayer 502a also includes electrically conductive vias 510a, 510b that traverse the thermally conductive layer 506a and electrically connect the electrically conductive layers 508a, 508b.

Further, the sublayer 502b includes a thermally conductive layer 506b with an electrically conductive layer 508c adhered to a top surface of the thermally conductive layer 506b, and an electrically conductive layer 508d adhered to a bottom surface of the thermally conductive layer 506b. The sublayer 502b also includes electrically conductive vias 510c, 510d that traverse the thermally conductive layer 506b and electrically connect the electrically conductive layers 508c, 508d. Generally, the dimensions of the various layers and components (e.g., the electrically conductive layers 508, the thermally conductive layers 506, and/or the vias 510) may be the same as corresponding layers described above with reference to FIGS. 3 and 4.

To enable the heat structure 116 to be attached to the wireless device, an adhesive layer 504b is applied between the electrically conductive layer 508d and a corresponding internal surface of the wireless device 102. In at least one implementation, the adhesive layer 504b can be electrically conductive to cause conductive layers of the heat structure 116 to be grounded to each other, such as depending on an electrical ground topology utilized for the heat structure 116. In this particular example, the heat structure 116 includes a ground connection 512 electrically connected to the electrically conductive layer 508a and a ground connection of the wireless device 102, and that functions to ground the heat structure 116 relative to the wireless device 102.

Further depicted in the cross section 500 is an antenna cross section 514 of the antenna 114 positioned adjacent (e.g., on the surface of) the heat structure 116. Thus, in an additional or alternative implementation to positioning an antenna within a cavity in the heat structure 116, an antenna can be placed externally to the heat structure 116.

Figure 6:
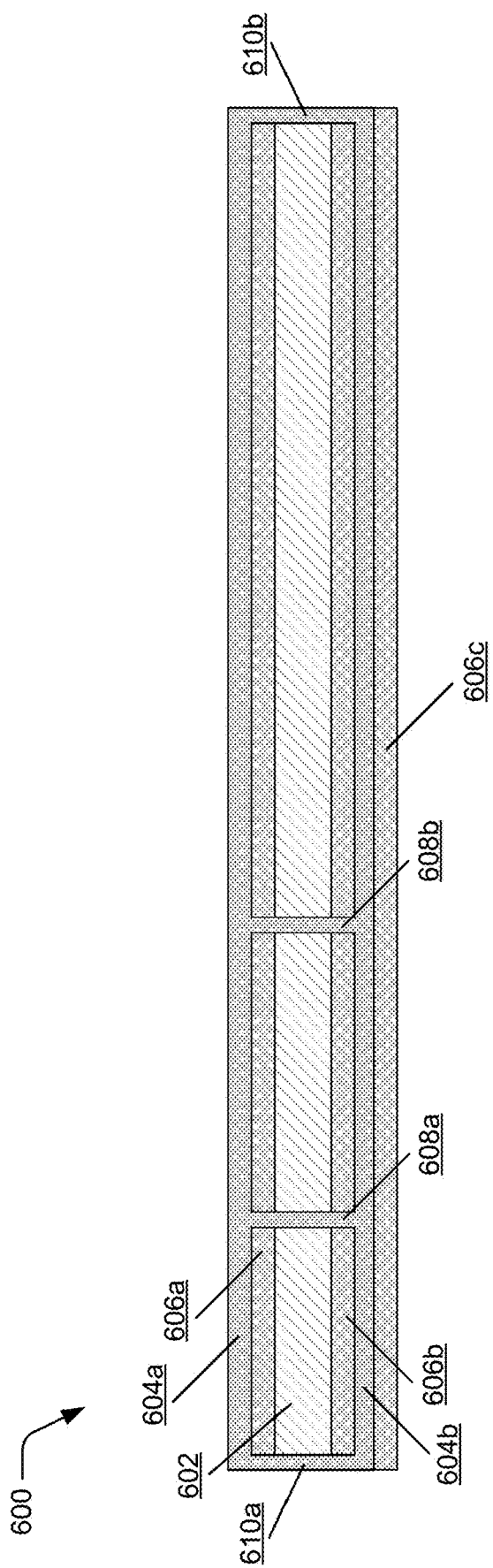
FIG. 6 depicts a cross section of another example implementation of a heat structure.

FIG. 6 depicts a cross section 600 of another example implementation of the heat structure 116. In this particular example, the heat structure 116 includes a thermally conductive layer 602 with an electrically conductive layer 604a adhered to a top surface of the thermally conductive layer 602 via an adhesive layer 606a. Further, an electrically conductive layer 604b is adhered to a bottom surface of the thermally conductive layer 602 via an adhesive layer 606b. The cross section 600 also depicts electrically conductive vias 608a, 608b that traverse the thermally conductive layer 602 and the adhesive layers 606a, 606b to electrically connect the electrically conductive layers 604a, 604b to one another. In at least one implementation, the adhesive layers 606a, 606b can be electrically conductive to cause conductive layers of the heat structure 116 to be grounded to each other, such as depending on an electrical ground topology utilized for the heat structure 116.

In this particular example, the heat structure 116 includes edge caps 610a, 610b that are adhered to external edges of the heat structure 116. The edge caps 610a, 610b, for instance, are electrically conductive and are formed to electrically connect the electrically conductive layers 604a, 604b along edges of the heat structure 116. The edge caps 610a, 610b, for instance, are formed from the same material as the electrically conductive layers 604a, 604b. In at least one implementation, the edge caps 610a, 601b are part of an edge layer that traverses an entire peripheral edge of the heat structure 116 and encapsulates (e.g., fully surrounds) the thermally conductive layer 602 such that the thermally conductive layer 602 is not exposed externally to the heat structure 116. In at least one implementation, the edge caps 610a, 610b further enhance wireless performance of an associated wireless device by further preventing wireless signal from being incident on and/or absorbed by the thermally conductive layer 602. The cross section 600 also depicts an adhesive layer 606c that is used to adhere the heat structure 116 to the wireless device 102. In at least one implementation, the adhesive layer 606c can be electrically conductive to cause conductive layers of the heat structure 116 to be grounded to each other and the wireless device ground, such as depending on an electrical ground topology utilized for the heat structure 116. Generally, the dimensions of the various components and layers depicted in the cross section 600 (e.g., the electrically conductive layers 604, the thermally conductive layer 602, and/or the vias 608) can be the same as corresponding dimensions of corresponding layers discussed in the previous implementations.

The various implementations depicted and discussed above may be combined and iterated in various ways to provide a wide variety of different heat structures for use in controlling and mitigating thermal conditions in different types of devices.

Figure 7:
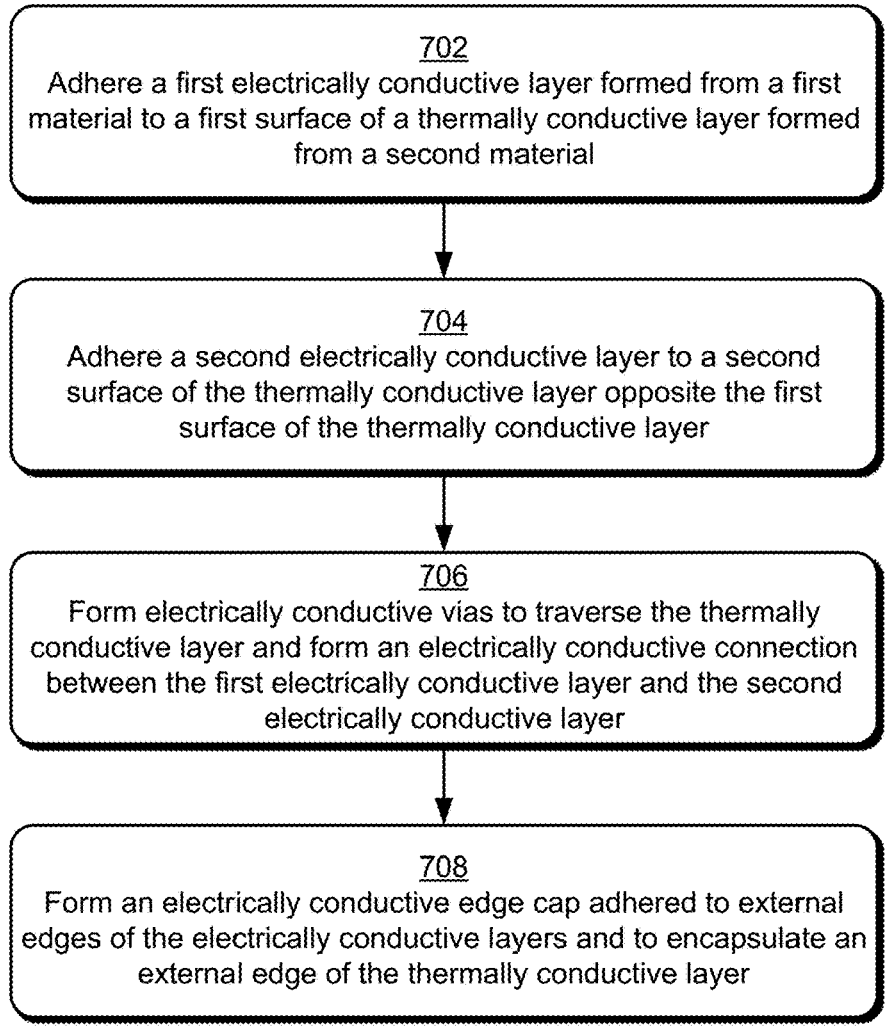
FIG. 7 illustrates an example method of fabricating a heat structure in accordance with one or more implementations of the techniques described herein.

FIG. 7 illustrates an example method 700 of fabricating a heat structure according to various implementations. The order in which the method is described is not intended to be construed as a limitation, and any number or combination of the described method operations can be performed in any order to perform a method, or an alternate method.

At 702, a first electrically conductive layer formed from a first material is adhered to a first surface of a thermally conductive layer formed from a second material. As discussed above, the various electrically conductive layers may be formed from any suitable electrical conductor, examples of which are discussed above. Further, any suitable adhesion technique may be utilized. Generally, the first electrically conductive layer has a thickness corresponding at least to a skin depth of the first material, and the first material has a greater electrical conductivity than the second material.

At 704, a second electrically conductive layer is adhered to a second surface of the thermally conductive layer opposite the first surface of the thermally conductive layer. The second electrically conductive layer may be formed from a same material as the first electrically conductive layer, or from a different electrically conductive material.

At 706, electrically conductive vias are formed to traverse the thermally conductive layer and form an electrically conductive connection between the first electrically conductive layer and the second electrically conductive layer. The electrically conductive vias, for instance, may be formed from a same material as the electrically conductive layers, or from a different electrically conductive material.

At 708, an electrically conductive edge cap is adhered to one or more external edges of the electrically conductive layers to encapsulate an external edge of the thermally conductive layer. The edge cap, for instance, extends partially or fully around a periphery of the heat structure to connect the electrically conductive layers and partially or fully encapsulate the thermally conductive layer. Generally, electrically conductive edge cap may be formed from a same material as the electrically conductive layers, or from a different electrically conductive material.

According to various implementations, this procedure may be performed iteratively, such as to generate multiple sublayers that can be combined (e.g., adhered to one another) to generate a heat structure with multiple different sublayers. Further, cavities may be formed in the different layers to accommodate components of a device, such as internal components of the wireless device 102.

Figure 8:
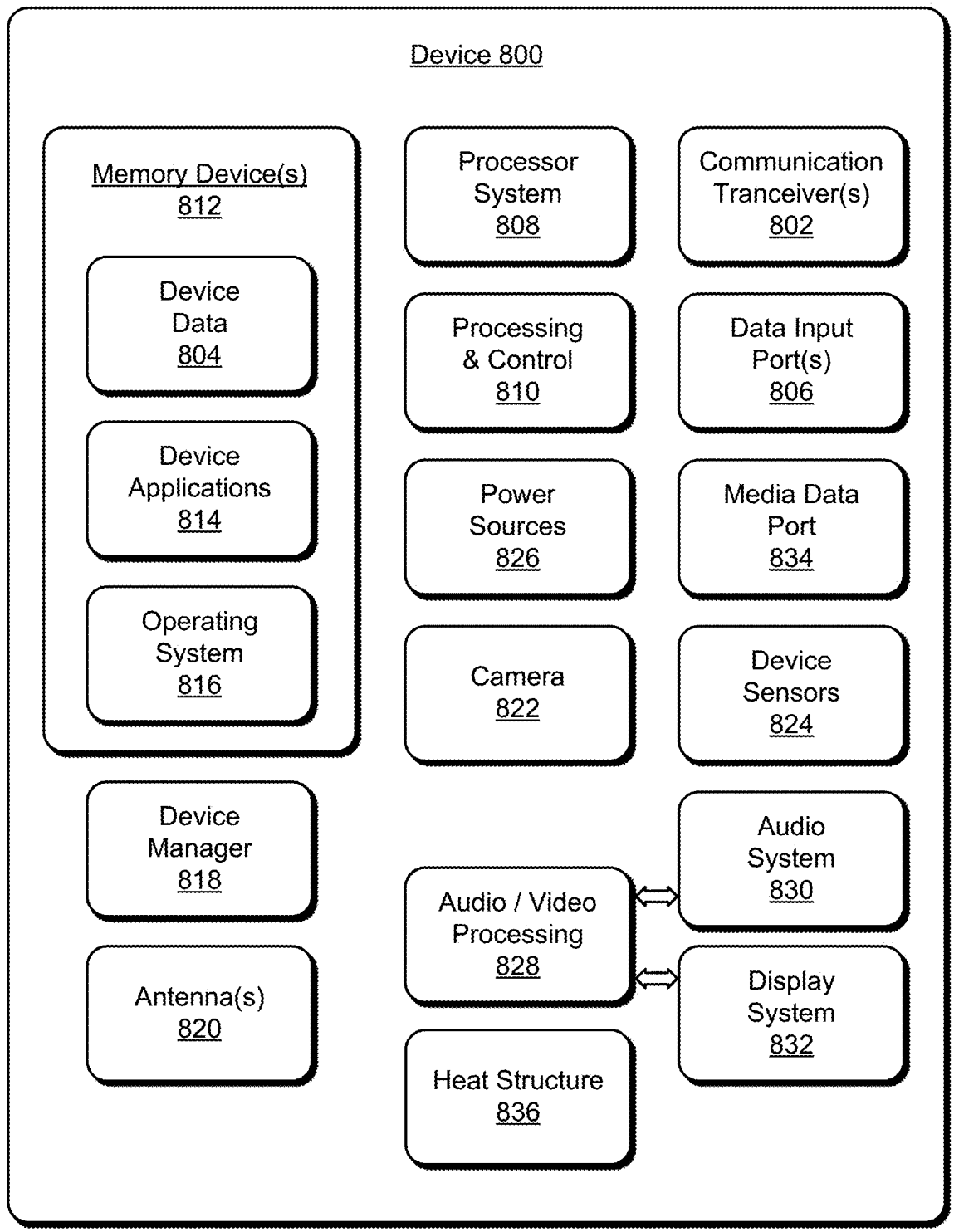
FIG. 8 illustrates various components of an example device that can used to implement the techniques of heat structure for thermal mitigation as described herein.

FIG. 8 illustrates various components of an example device 800, in which aspects of heat structure for thermal mitigation can be implemented. The example device 800 can be implemented as any of the devices described with reference to the previous FIGS. 1-7, such as any type of a wireless device, mobile phone, client device, companion device, paired device, display device, tablet, computing, communication, entertainment, gaming, media playback, and/or any other type of computing and/or electronic device. For example, the wireless device 102 described above may be implemented as the example device 800.

The device 800 includes communication transceivers 802 that enable wired and/or wireless communication of device data 804 with other devices. The device data 804 can include any type of audio, video, and/or image data. Example communication transceivers 802 include wireless personal area network (WPAN) radios compliant with various IEEE 802.15 (Bluetooth™) standards, wireless local area network (WLAN) radios compliant with any of the various IEEE 802.11 (WiFi™) standards, wireless wide area network (WWAN) radios for cellular phone communication, wireless metropolitan area network (WMAN) radios compliant with various IEEE 802.16 (WiMAX™) standards, and wired local area network (LAN) Ethernet transceivers for network data communication.

The device 800 may also include one or more data input ports 806 via which any type of data, media content, and/or inputs can be received, such as user-selectable inputs to the device, messages, music, television content, recorded content, and any other type of audio, video, and/or image data received from any content and/or data source. The data input ports may include USB ports, coaxial cable ports, and other serial or parallel connectors (including internal connectors) for flash memory, DVDs, CDs, and the like. These data input ports may be used to couple the device to any type of components, peripherals, or accessories such as microphones and/or cameras.

The device 800 includes a processor system 808 of one or more processors (e.g., any of microprocessors, controllers, and the like) and/or a processor and memory system implemented as a system-on-chip (SoC) that processes computer-executable instructions. The processor system may be implemented at least partially in hardware, which can include components of an integrated circuit or on-chip system, an application-specific integrated circuit (ASIC), a field-programmable gate array (FPGA), a complex programmable logic device (CPLD), and other implementations in silicon and/or other hardware. Alternatively or in addition, the device can be implemented with any one or combination of software, hardware, firmware, or fixed logic circuitry that is implemented in connection with processing and control circuits, which are generally identified at 810. The device 800 may further include any type of a system bus or other data and command transfer system that couples the various components within the device. A system bus can include any one or combination of different bus structures and architectures, as well as control and data lines.

The device 800 also includes computer-readable storage memory 812 (e.g., memory devices) that enable data storage, such as data storage devices that can be accessed by a computing device, and that provide persistent storage of data and executable instructions (e.g., software applications, programs, functions, and the like). Examples of the computer-readable storage memory 812 include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage media in various memory device configurations. The device 800 may also include a mass storage media device.

The computer-readable storage memory 812 provides data storage mechanisms to store the device data 804, other types of information and/or data, and various device applications 814 (e.g., software applications). For example, an operating system 816 can be maintained as software instructions with a memory device and executed by the processor system 808. The device applications may also include a device manager 818, such as any form of a control application, software application, signal-processing and control module, code that is native to a particular device, a hardware abstraction layer for a particular device, and so on.

In this example, the device 800 includes one or more antennas 820 further to implementations of heat structure for thermal mitigation. Examples of the antenna 820 include the antenna 114 described with reference to FIG. 1, and may represent multiple antennas positioned at various regions of the wireless device 102 described above.

In this example, the device 800 also includes a camera 822 and device sensors 824, such as a temperature sensor to monitor device component operating temperatures (to include the antenna modules 820), and device sensors such as may be implemented as components of an inertial measurement unit (IMU). The device sensors 824 can be implemented with various motion sensors, such as a gyroscope, an accelerometer, and/or other types of motion sensors to sense motion of the device. The motion sensors can generate sensor data vectors having three-dimensional parameters (e.g., rotational vectors in x, y, and z-axis coordinates) indicating location, position, acceleration, rotational speed, and/or orientation of the device. The device 800 can also include one or more power sources 826, such as when the device is implemented as a wireless device or collaborative device. The power sources may include a charging and/or power system, and can be implemented as a flexible strip battery, a rechargeable battery, a charged super-capacitor, and/or any other type of active or passive power source.

The device 800 can also include an audio and/or video processing system 828 that generates audio data for an audio system 830 and/or generates display data for a display system 832. The audio system and/or the display system may include any devices that process, display, and/or otherwise render audio, video, display, and/or image data. Display data and audio signals can be communicated to an audio component and/or to a display component via an RF (radio frequency) link, S-video link, HDMI (high-definition multimedia interface), composite video link, component video link, DVI (digital video interface), analog audio connection, or other similar communication link, such as media data port 834. In implementations, the audio system and/or the display system are integrated components of the example device. Alternatively, the audio system and/or the display system are external, peripheral components to the example device.

The device 800 further includes a heat structure 836 that enables thermal conditions within the device 800 to be controlled. The heat structure 836, for instance, enables heat generated by other components of the device 800 to be delocalized (e.g., spread out) and dissipated from the device 800. In at least one implementation, the heat structure 836 represents an implementation of the heat structure 116 detailed above.

Although implementations of heat structure for thermal mitigation have been described in language specific to features and/or methods, the subject of the appended claims is not necessarily limited to the specific features or methods described. Rather, the specific features and methods are disclosed as example implementations of heat structure for thermal mitigation, and other equivalent features and methods are intended to be within the scope of the appended claims. Further, various different examples are described and it is to be appreciated that each described example can be implemented independently or in connection with one or more other described examples. Additional aspects of the techniques, features, and/or methods discussed herein relate to one or more of the following:

A wireless device, comprising: a device housing with internal components situated therein, the internal components including one or more antennas; and a heat structure positioned within the device housing to dissipate heat generated at least in part by the internal components, the heat structure including: a thermally conductive layer formed from a first material; a first electrically conductive layer formed from a second material and adhered to a first surface of the thermally conductive layer, the first electrically conductive layer having a thickness corresponding at least to a skin depth of the second material and the second material having a greater electrical conductivity than the first material; a second electrically conductive layer adhered to a second surface of the thermally conductive layer opposite the first surface of the thermally conductive layer; and one or more electrically conductive vias that traverse the thermally conductive layer and form an electrically conductive connection between the first electrically conductive layer and the second electrically conductive layer.

In addition to the above-described wireless device, any one or more of the following: wherein the thickness of the first electrically conductive layer is greater than the skin depth value; wherein the heat structure includes one or more cavities into which one or more of the internal components extend; wherein the one or more antennas are implemented for millimeter wave (mmW) RF transmission for 5G cellular network communication for the wireless device; wherein the heat structure is positioned within the device housing overlapping at least some of the internal components; wherein the heat structure further comprises an adhesive layer that adheres the second electrically conductive layer to the at least some of the internal components; wherein the heat structure includes a cavity in which an antenna of the one or more antennas is positioned in a coplanar orientation relative to the heat structure; wherein an antenna of the one or more antennas is positioned overlapping a portion of the first electrically conductive layer; wherein the heat structure further comprises an edge cap adhered to at least one external edge of the heat structure, the edge cap traversing an edge of the thermally conductive layer and forming an electrically conductive connection between the first electrically conductive layer and the second electrically conductive layer; wherein the edge cap extends along multiple external edges of the heat structure and encapsulates the thermally conductive layer such that the thermally conductive layer is not exposed externally to the heat structure or the one or more antennas; wherein one or more of the first electrically conductive layer or the second electrically conductive layer is electrically grounded relative to one or more of the internal components.

A heat structure for dissipating heat, comprising: a thermally conductive layer formed from a first material; a first electrically conductive layer formed from a second material and adhered to a first surface of the thermally conductive layer, the first electrically conductive layer having a thickness corresponding at least to a skin depth of the second material and the second material having a greater electrical conductivity than the first material; a second electrically conductive layer adhered to a second surface of the thermally conductive layer opposite the first surface of the thermally conductive layer; and one or more electrically conductive vias that traverse the thermally conductive layer and form an electrically conductive connection between the first electrically conductive layer and the second electrically conductive layer.

In addition to the above-described heat structure, any one or more of the following: wherein the thickness of the first electrically conductive layer is greater than the skin depth value; wherein one or more of the first electrically conductive layer or the second electrically conductive layer is adhered to the thermally conductive layer via a non-electrically conductive adhesive, and wherein the one or more electrically conductive vias traverse the non-electrically conductive adhesive to electrically connect the first electrically conductive layer and the second electrically conductive layer; further comprising an edge cap adhered to at least one external edge of the heat structure, the edge cap traversing an external edge of the thermally conductive layer and forming an electrically conductive connection between the first electrically conductive layer and the second electrically conductive layer; wherein the edge cap extends along multiple external edges of the heat structure and encapsulates the thermally conductive layer such that the thermally conductive layer is not exposed externally to the heat structure; further comprising: a third electrically conductive layer adhered to the second electrically conductive layer using a non-electrically conductive adhesive; a further thermally conductive layer adhered to the third electrically conductive layer along a first surface of the further thermally conductive layer; a fourth electrically conductive layer adhered to a second surface of the further thermally conductive layer opposite the first surface of the further thermally conductive layer; and one or more further electrically conductive vias that traverse the further thermally conductive layer and form an electrically conductive connection between the third electrically conductive layer and the fourth electrically conductive layer, wherein the one or more further electrically conductive vias do not traverse the non-electrically conductive adhesive between the third electrically conductive layer and the second electrically conductive layer.

A method for generating a heat structure, comprising: adhering a first electrically conductive layer formed from a first material to a first surface of a thermally conductive layer formed from a second material, the first electrically conductive layer having a thickness corresponding at least to a skin depth of the first material and the first material having a greater electrical conductivity than the second material; adhering a second electrically conductive layer to a second surface of the thermally conductive layer opposite the first surface of the thermally conductive layer; and forming one or more electrically conductive vias to traverse the thermally conductive layer and form an electrically conductive connection between the first electrically conductive layer and the second electrically conductive layer.

In addition to the above-described method, any one or more of the following: further comprising forming the first electrically conductive layer to have a thickness that is greater than the skin depth value; further comprising forming an electrically conductive edge cap adhered to one or more external edges of the heat structure and encapsulating one or more external edges of the thermally conductive layer.

The invention claimed is:

1. A wireless device, comprising:
a device housing with internal components situated therein, the internal components including one or more antennas; and
a heat structure positioned within the device housing to dissipate heat generated at least in part by the internal components, the heat structure including:
a thermally conductive layer formed from a first material;
a first electrically conductive layer formed from a second material and adhered to a first surface of the thermally conductive layer, the first electrically conductive layer having a thickness corresponding at least to a skin depth of the second material and the second material having a greater electrical conductivity than the first material;
a second electrically conductive layer adhered to a second surface of the thermally conductive layer opposite the first surface of the thermally conductive layer; and
one or more electrically conductive vias that traverse the thermally conductive layer and form an electrically conductive connection between the first electrically conductive layer and the second electrically conductive layer.

2. The wireless device as recited in claim 1, wherein the thickness of the first electrically conductive layer is greater than the skin depth value.

3. The wireless device as recited in claim 1, wherein the heat structure includes one or more cavities into which one or more of the internal components extend.

4. The wireless device as recited in claim 1, wherein the one or more antennas are implemented for millimeter wave (mmW) RF transmission for 5G cellular network communication for the wireless device.

5. The wireless device as recited in claim 1, wherein the heat structure is positioned within the device housing overlapping at least some of the internal components.

6. The wireless device as recited in claim 5, wherein the heat structure further comprises an adhesive layer that adheres the second electrically conductive layer to the at least some of the internal components.

7. The wireless device as recited in claim 1, wherein the heat structure includes a cavity in which an antenna of the one or more antennas is positioned in a coplanar orientation relative to the heat structure.

8. The wireless device as recited in claim 1, wherein an antenna of the one or more antennas is positioned overlapping a portion of the first electrically conductive layer.

9. The wireless device as recited in claim 1, wherein the heat structure further comprises an edge cap adhered to at least one external edge of the heat structure, the edge cap traversing an edge of the thermally conductive layer and forming an electrically conductive connection between the first electrically conductive layer and the second electrically conductive layer.

10. The wireless device as recited in claim 9, wherein the edge cap extends along multiple external edges of the heat structure and encapsulates the thermally conductive layer such that the thermally conductive layer is not exposed externally to the heat structure or the one or more antennas.

11. The wireless device as recited in claim 1, wherein one or more of the first electrically conductive layer or the second electrically conductive layer is electrically grounded relative to one or more of the internal components.

12. A heat structure for dissipating heat, comprising:
a thermally conductive layer formed from a first material;
a first electrically conductive layer formed from a second material and adhered to a first surface of the thermally conductive layer, the first electrically conductive layer having a thickness corresponding at least to a skin depth of the second material and the second material having a greater electrical conductivity than the first material;
a second electrically conductive layer adhered to a second surface of the thermally conductive layer opposite the first surface of the thermally conductive layer; and
one or more electrically conductive vias that traverse the thermally conductive layer and form an electrically conductive connection between the first electrically conductive layer and the second electrically conductive layer.

13. The heat structure as recited in claim 12, wherein the thickness of the first electrically conductive layer is greater than the skin depth value.

14. The heat structure as recited in claim 12, wherein one or more of the first electrically conductive layer or the second electrically conductive layer is adhered to the thermally conductive layer via a non-electrically conductive adhesive, and wherein the one or more electrically conductive vias traverse the non-electrically conductive adhesive to electrically connect the first electrically conductive layer and the second electrically conductive layer.

15. The heat structure as recited in claim 12, further comprising an edge cap adhered to at least one external edge of the heat structure, the edge cap traversing an external edge of the thermally conductive layer and forming an electrically conductive connection between the first electrically conductive layer and the second electrically conductive layer.

16. The heat structure as recited in claim 15, wherein the edge cap extends along multiple external edges of the heat structure and encapsulates the thermally conductive layer such that the thermally conductive layer is not exposed externally to the heat structure.

17. The heat structure as recited in claim 12, further comprising:
a third electrically conductive layer adhered to the second electrically conductive layer using a non-electrically conductive adhesive;
a further thermally conductive layer adhered to the third electrically conductive layer along a first surface of the further thermally conductive layer;
a fourth electrically conductive layer adhered to a second surface of the further thermally conductive layer opposite the first surface of the further thermally conductive layer; and
one or more further electrically conductive vias that traverse the further thermally conductive layer and form an electrically conductive connection between the third electrically conductive layer and the fourth electrically conductive layer, wherein the one or more further electrically conductive vias do not traverse the non-electrically conductive adhesive between the third electrically conductive layer and the second electrically conductive layer.

18. A method for generating a heat structure, comprising:
adhering a first electrically conductive layer formed from a first material to a first surface of a thermally conductive layer formed from a second material, the first electrically conductive layer having a thickness corresponding at least to a skin depth of the first material and the first material having a greater electrical conductivity than the second material;
adhering a second electrically conductive layer to a second surface of the thermally conductive layer opposite the first surface of the thermally conductive layer; and
forming one or more electrically conductive vias to traverse the thermally conductive layer and form an electrically conductive connection between the first electrically conductive layer and the second electrically conductive layer.

19. The method as recited in claim 18, further comprising forming the first electrically conductive layer to have a thickness that is greater than the skin depth value.

20. The method as recited in claim 18, further comprising forming an electrically conductive edge cap adhered to one or more external edges of the heat structure and encapsulating one or more external edges of the thermally conductive layer.

* * * * *